(12) United States Patent
Jeon

(10) Patent No.: US 9,246,129 B2
(45) Date of Patent: Jan. 26, 2016

(54) DISPLAY DEVICE

(71) Applicant: SAMSUNG DISPLAY CO., LTD., Yongin-si, Gyeonggi-do (KR)

(72) Inventor: Hee-Chul Jeon, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/484,134

(22) Filed: Sep. 11, 2014

(65) Prior Publication Data

US 2015/0303403 A1 Oct. 22, 2015

(30) Foreign Application Priority Data

Apr. 16, 2014 (KR) ........................ 10-2014-0045311

(51) Int. Cl.
| | |
|---|---|
| *H01L 35/24* | (2006.01) |
| *H01L 51/00* | (2006.01) |
| *H01L 51/52* | (2006.01) |
| *H01L 27/32* | (2006.01) |
| *G02F 1/1339* | (2006.01) |

(52) U.S. Cl.
CPC .......... *H01L 51/5246* (2013.01); *G02F 1/1339* (2013.01); *G02F 1/13394* (2013.01); *H01L 27/3246* (2013.01); *G02F 2001/13396* (2013.01); *G02F 2001/13398* (2013.01); *H01L 2251/558* (2013.01)

(58) Field of Classification Search
CPC ... H01L 21/041; H01L 21/043; H01L 21/048; H01L 21/0445; H01L 21/28079; H01L 21/8238; H01L 27/1104; H01L 27/0814; H01L 27/3248; H01L 29/4908; H01L 29/6603; H01L 29/66204; H01L 29/66045; H01L 51/008; H01L 51/0508; H01L 51/5296; H01L 51/5287

USPC ............ 257/40, 79, 104, 642, 192, 213, 249, 257/292, 300, 359, 410, 411, 701, 607, 759, 257/760, 762, 763, 764, 765, 910, E21.006, 257/E21.008, E21.05, E21.051, E21.053, 257/E21.352, E21.267, E21.278, E21.293, 257/E21.368, E21.411

See application file for complete search history.

(56) References Cited

U.S. PATENT DOCUMENTS

| | | | | |
|---|---|---|---|---|
| 7,759,675 | B2* | 7/2010 | Lee | ................................ 257/40 |
| 7,990,061 | B2* | 8/2011 | Kim | .............................. 313/512 |
| 8,174,822 | B2* | 5/2012 | Kim et al. | ................ 361/679.01 |

(Continued)

FOREIGN PATENT DOCUMENTS

| | | |
|---|---|---|
| KR | 10-2002-0039453 A | 5/2002 |
| KR | 10-2002-0093984 A | 12/2002 |
| KR | 10-2012-0023898 A | 3/2012 |

*Primary Examiner* — David Nhu
(74) *Attorney, Agent, or Firm* — Knobbe, Martens, Olson & Bear, LLP

(57) ABSTRACT

A display device is disclosed. In one aspect, the device includes a first substrate in which an image displaying area and a non-displaying area are formed, a second substrate facing the first substrate, a first electrode formed over the first substrate, an emission layer formed over the first electrode and a second electrode formed over the emission layer. The device further includes a sealing member interposed between the non-displaying area of the first substrate and the second substrate, a reinforcement member interposed between the non-displaying area of the first substrate and the second substrate, the reinforcement member being adjacent to the sealing member and at least one spacer formed adjacent to the reinforcement member.

20 Claims, 4 Drawing Sheets

(56) References Cited

U.S. PATENT DOCUMENTS

| | | | |
|---|---|---|---|
| 8,415,880 B2 * | 4/2013 | Choi et al. | 313/512 |
| 8,625,290 B2 * | 1/2014 | Wee et al. | 361/752 |
| 9,004,972 B2 * | 4/2015 | Choi et al. | 313/512 |
| 2004/0124423 A1 | 7/2004 | Lih et al. | |

* cited by examiner

DISPLAY DEVICE

INCORPORATION BY REFERENCE TO ANY PRIORITY APPLICATIONS

This application claims priority to and the benefit of Korean Patent Application No. 10-2014-0045311, filed on Apr. 16, 2014, with the Korean Intellectual Property Office, the disclosure of which application is incorporated herein in its entirety by reference.

BACKGROUND

1. Field

The described technology generally relates to a display device including a spacer configured to apply a reinforcement material uniformly.

2. Description of the Related Technology

In general, flat or, thin panel displays (FPDs) such as liquid crystal displays (LCDs) and organic light-emitting diode (OLED) displays include opposed electric field generating electrodes and an electro-optically active layer formed to be affected by correspondingly generated electric fields. A liquid crystal layer of an LCD is included as the electro-optically active layer, and an organic light-emitting layer of an OLED display is included as the electro-optically active layer.

One of the opposed electric field generating electrodes is generally connected to a switching element so that it receives an electrical signal on a selective basis. The electro-optically active layer is affected by the received electrical signal such that it forms a corresponding optical signal as part of a formed and to be displayed image.

A liquid crystal panel includes a lower substrate including a plurality of elements and an upper substrate including a color filter, and also includes a sealing material that bonds the two substrates together between the upper and lower substrates.

A pair of substrates facing each other with a matrix of OLEDs interposed therebetween are sealingly bonded to each other utilizing a sealing material such that OLED displays are manufactured. The sealing material is formed to surround the OLEDs along an edge of the substrate.

Regarding brittleness of the sealing material, when the sealing material is subjected to an external impact, stress is intensively applied to a bonded surface of the sealing material and the substrate, and accordingly a crack is formed in some of the bonded surface and the crack appears undesirably in the entire substrate along the bonded surface.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY OF CERTAIN INVENTIVE ASPECTS

One inventive aspect is a display device including a spacer configured to apply a reinforcement material uniformly.

Another aspect is a display device includes: a first substrate including an image displaying area and a non-displaying area; a second substrate facing the first substrate; a first electrode on the first substrate; an emission layer on the first electrode; a second electrode on the emission layer; a sealing material between the non-displaying area of the first substrate and the second substrate; a reinforcement material between the non-displaying area of the first substrate and the second substrate, the reinforcement material being adjacent to the sealing material; and at least one spacer formed adjacent to the reinforcement material.

The spacer may be implemented as a plurality of first spacers formed parallel to a long side of the reinforcement material; and a plurality of second spacers respectively formed adjacent to a short side of the reinforcement material in a direction orthogonal to the first spacers.

The spacer may have a width in a range of 1 µm to 2 µm.

The first spacer may be formed adjacent to a long side of the reinforcement material.

The reinforcement material may include a protrusion between the spacers.

The second spacers may be spaced apart from each other.

The first spacer may have a length in a range of 0.4 µm to 0.6 µm.

The second spacer may have a length in a range of 0.1 µm to 0.25 µm.

The display device may further include a pixel defining layer on the first substrate and the pixel defining layer may have an opening corresponding to the first electrode.

The spacer and the pixel defining layer may be made of the same material as each other.

The spacer may have the same height as the sealing material. The sealing material may include a frit.

Another aspect is a display device comprising: a first substrate in which an image displaying area and a non-displaying area are defined; a second substrate facing the first substrate; a first electrode formed over the first substrate; an emission layer formed over the first electrode; a second electrode formed over the emission layer; a sealing member interposed between the non-displaying area of the first substrate and the second substrate; a reinforcement member interposed between the non-displaying area of the first substrate and the second substrate, the reinforcement member being adjacent to the sealing member; and at least one spacer formed adjacent to the reinforcement member.

In the above display device, wherein the spacer comprises: a plurality of first spacers formed substantially parallel to a first side of the reinforcement member; and a plurality of second spacers respectively formed adjacent to a second side of the reinforcement member in a direction substantially perpendicular to the first spacers, wherein the second side is shorter than the first side. In the above display device, the spacer has a width in the range of about 1 µm to about 2 µm. In the above display device, the first spacers are formed adjacent to a long side of the reinforcement member. In the above display device, the reinforcement member comprises a protrusion between spacers. In the above display device, the second spacers are spaced apart from each other.

In the above display device, each of the first spacers has a length in the range of about 0.4 µm to about 0.6 µm. In the above display device, each of the second spacers has a length in the range of about 0.1 µm to about 0.25 µm. The above display device further comprises a pixel defining layer formed over the first substrate, the pixel defining layer having an opening corresponding to the first electrode. In the above display device, the spacer and the pixel defining layer are formed of the same material. In the above display device, the spacer has substantially the same height as the sealing member. In the above display device, the sealing member comprises a frit.

Another aspect is a display device comprising: a first substrate in which an image displaying area and a non-displaying area are defined; a second substrate facing the first substrate;

a sealing member interposed between the non-displaying area of the first substrate and the second substrate; a reinforcement member interposed between the non-displaying area of the first substrate and the second substrate, the reinforcement member being adjacent to the sealing member; and at least one spacer formed adjacent to the reinforcement member, wherein the spacer comprises: a plurality of first spacers formed substantially parallel to a first side of the reinforcement member; and a plurality of second spacers respectively formed adjacent to a second side of the reinforcement member in a direction substantially perpendicular to the first spacers, wherein the second side is shorter than the first side.

In the above display device, each of the first and second spacers has a width in the range of about 1 µm to about 2 µm. In the above display device, each of the first and second spacers has substantially the same height as the sealing member. In the above display device, the reinforcement member comprises a protrusion between the spacers. In the above display device, the second spacers are spaced apart from each other. In the above display device, each of the first spacers has a length in the range of about 0.4 µm to about 0.6 µm. In the above display device, each of the second spacers has a length in the range of about 0.1 µm to about 0.25 µm. In the above display device, the first spacers are formed adjacent to the first side of the reinforcement member.

According to at least one of the disclosed embodiments, a display device may increase an area where a reinforcing material is applied, improve uniformity of the reinforcing material, and enhance mechanical strength of the display device.

The foregoing is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF CERTAIN INVENTIVE EMBODIMENTS

Figure 1:
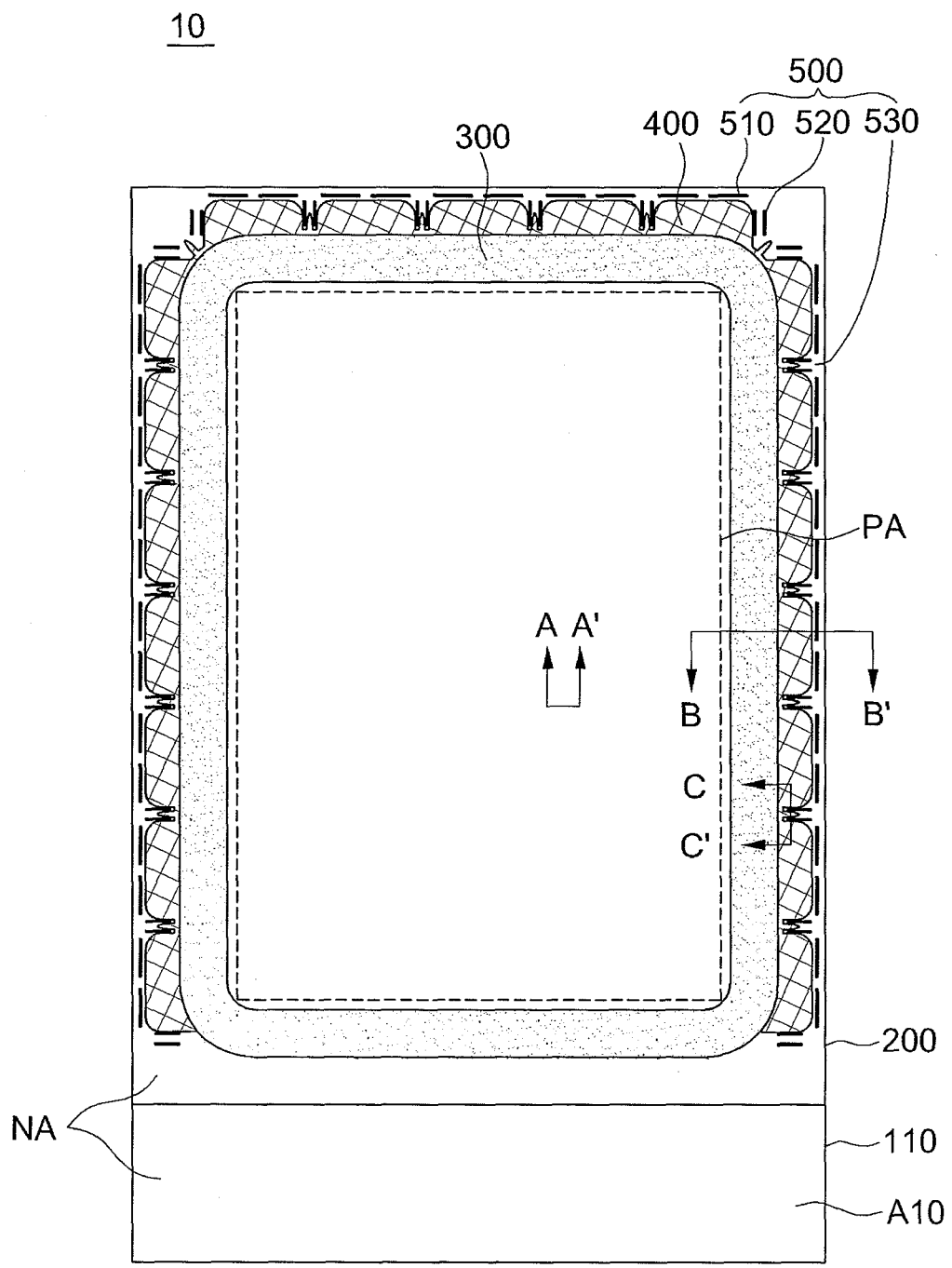
FIG. 1 is a schematic plan view showing a display device structured in accordance with an embodiment.

Generally, in order to prevent cracks in a cured sealing material and a display substrate, a reinforcement material is formed adjacent to the sealing material. This serves to disperse the force of an external impact. However, since mechanical strength can vary, the reinforcement material needs to be uniformly applied, which is difficult to achieve in practice.

Advantages and features of structures formed in accordance with the present disclosure and methods for achieving them will be made clear from embodiments described below in more detail with reference to the accompanying drawings. The present teachings may, however, be embodied in many different forms and should not be construed as being limited to the specific embodiments set forth herein. Rather, these embodiments are provided so that this disclosure will be thorough and complete, and will fully convey the scope of the present teachings to those skilled in the pertinent art. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular embodiments only and is not construed as limiting the invention. As used herein, the singular forms "a," "an" and "the" are intended to include the plural forms as well, unless the context clearly indicates otherwise. It will be further understood that the terms "comprises" and/or "comprising," when used in this specification, specify the presence of mentioned component, step, operation and/or element, but do not exclude the presence or addition of one or more other components, steps, operations and/or elements. In this disclosure, the term "substantially" includes the meanings of completely, almost completely or to any significant degree under some applications and in accordance with those, skilled in the art. Moreover, "formed on" can also mean "formed over."

Unless otherwise defined, all terms used herein (including technical and scientific terms) have the same meaning as commonly understood by those skilled in the art to which the described technology pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a display device according to an embodiment will be described in detail with reference to FIGS. 1 to 5. A display device according to one embodiment may be an organic light-emitting diode display or a liquid crystal display. A display device described herein will be an organic light-emitting diode display.

Referring to FIG. 1, an organic light-emitting diode (OLED) display 10 includes a first substrate 110 that is partitioned into two areas: an image displaying area PA and a non-displaying area NA. The image displaying area PA of the first substrate 110 may include a plurality of pixels so as to display images and the non-displaying area NA may include one or more driver circuits. For instance, a driver circuit may be formed in an area (a pad area A10) of the first substrate 110 that is not covered with a second substrate 200 as illustrated in FIG. 1. However, according to some embodiments, the driver circuit is not always formed in the non-displaying area NA, and it may be omitted.

Figure 2A:
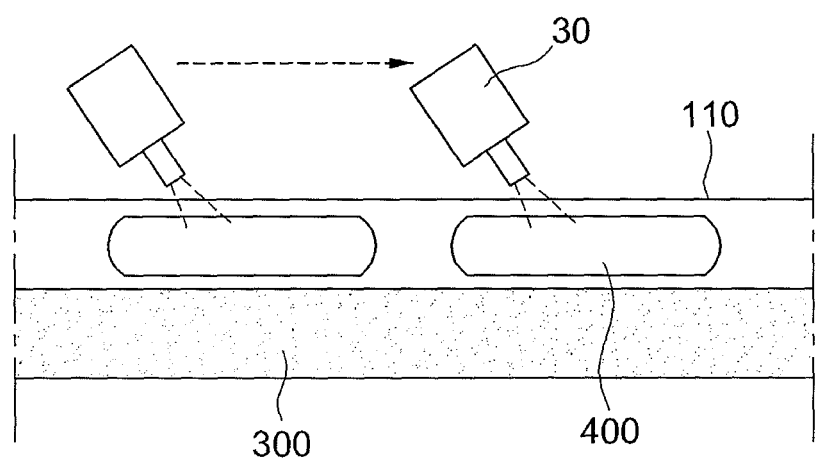
FIGS. 2A and 2B are diagrams illustrating gas inclusions generated by a process of injecting a reinforcing material.

A process of generating a gas inclusion in a reinforcing material 400 will be described below with reference to FIGS. 2A and 2B.

A sealing material or a sealing member 300 may be formed in the non-displaying area NA of the first substrate 110. A reinforcing material or a reinforcing member 400 may be applied for increasing intensity of the sealing material 300. For example, the reinforcing material 400 may be applied utilizing a typical syringe 30. The reinforcing material 400 may be injected at a predetermined time interval, thereby forming an empty space such as D shown in FIG. 2B. Air may infiltrate through the empty space. Uniformity inside the reinforcing material 400 may decrease due to the air infiltration.

Further, in the case where the reinforcing material 400 is applied, it may spill out of the first substrate 110.

In some embodiments, it is beneficial to prevent the reinforcing material 400 from spilling out of the first substrate 110 and also increase an area on which the reinforcing material 400 is applied.

In this respect, a display device according to an embodiment includes a spacer configured to apply the reinforcing material 400 substantially uniformly and prevent the reinforcing material 400 from generating the gas inclusion.

A configuration of the non-displaying area NA of the display device will be described below with reference to FIGS. 1 to 3.

The sealing material 300, the reinforcing material 400, and a spacer 500 may be formed in the non-displaying area NA of the first substrate 110.

The sealing material 300 may surround the image displaying area PA. The reinforcing material 400 and the spacer 500 may surround an upper side, and left and right sides of the image displaying area PA. The reinforcing material 400 and the spacer 500 may not be formed in the pad area A10. This is because a driver circuit may be formed in the pad area A10.

The sealing material 300 may be a sealant or may include a frit. The sealing material 300 may be formed between edge portions of the first and second substrates 110 and 200. That is, the sealing material 300 may be formed in the non-displaying area NA so as to surround the image displaying area PA of the first substrate 110. The sealing material 300 may sealingly bond the first and second substrates 110 and 200 to each other. The sealing material 300 may be made of various materials that are known to those skilled in the art.

Although not illustrated, a variety of conducting lines may be insulatedly formed to extend from the image displaying area PA to the non-displaying area NA so as to supply signals or power between the sealing materials 300 and the first substrate 110.

The reinforcing material 400 may be formed between edge portions of the first and second substrates 110 and 200. That is, the reinforcing material 400 may be formed in the non-displaying area NA so as to surround an upper side, and left and right sides of the sealing materials 300. The reinforcing material 400 may support the sealing materials 300 and may increase mechanical strength. The reinforcing material 400 may include at least one material selected from the group consisting of epoxy, acrylic, and urethane. The reinforcing material 400 may be made of various materials that are known to those skilled in the art.

The spacer 500 may define an area where the reinforcing material 400 is formed and may prevent a leak of the reinforcing material 400. The spacer 500 may be formed adjacent to the reinforcing material 400.

The spacer 500 may include a first spacer 510 and a second spacer 520. The spacer 500 used below refers to two first spacers 510 and two second spacers 520 that are formed in area E illustrated in FIG. 3. Accordingly, a plurality of spacers 500 may be formed in one embodiment. The spacer 500 may have a width in a range of about 1 μm to about 2 μm. However, depending on the embodiment, the width of the spacer 500 can potentially be outside this range.

The first spacer 510 may be formed in the non-displaying area NA of the first substrate 110 and may be formed substantially parallel to a long side of the reinforcing material 400. The first spacers 510 may be spaced apart from each other by a predetermined distance. The first spacer 510 may be formed adjacent to the long side of the reinforcing material 400.

The second spacer 520 may be formed between the reinforcing materials 400 in a direction substantially perpendicular to the first spacer 510. One or two more second spacers 520 may be spaced apart from each other by a predetermined distance. The second spacer 520 may be formed adjacent to a short side of the reinforcing material 400.

Figure 3:
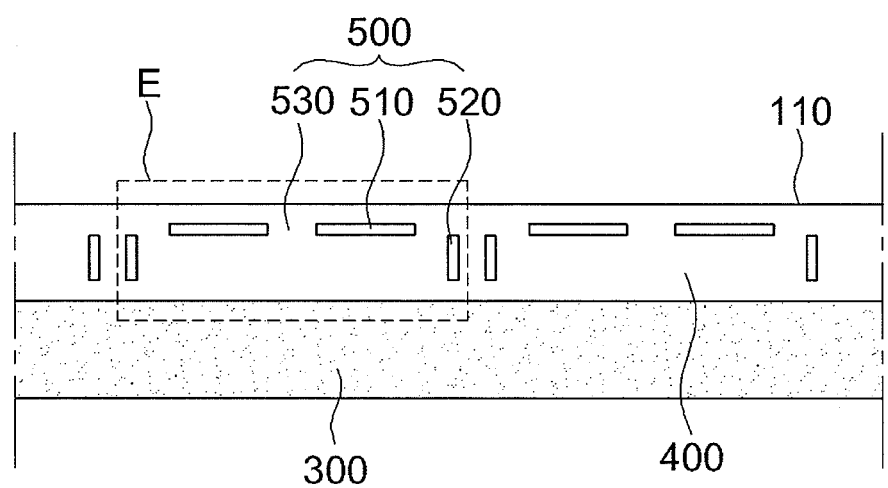
FIG. 3 is a plan view illustrating a sealing material and a spacer by enlarging a part of a non-displaying area of a first substrate.

Referring to FIG. 3, a pair of first spacers 510 and a pair of second spacers 520 may form one group. The pair of first spacers 510 denotes two first spacers 510 that are spaced apart from each other and formed substantially parallel to the reinforcing material 400. The pair of second spacers 520 may be formed in a direction substantially perpendicular to the two first spacers 510. For instance, one group may denote two first spacers 510 and two second spacers 520 that are included in area E as illustrated in FIG. 3.

A space between the pair of first spacers 510 may act as an injection opening 530. In other words, the reinforcing material 400 may be injected through the injection opening 530. Therefore, the reinforcing material 400 may be injected into each group.

The distance between the respective injection openings 530 may be in a range of about 1 μm to about 2 μm. Accordingly, the first spacer 510 may have a length in a range of about 0.4 μm to about 0.6 μm. The second spacer 520 may have a length in a range of about 0.1 μm to about 0.25 μm. However, the above ranges are for illustrative purposes only, and the distance of the spacer 500 may be variable according to the width of the non-displaying area NA of a display device.

Referring to FIG. 1, the spacer 500 may be plurally formed on an upper side, and right and left sides of the substrate along the outside of the sealing material 300. A pair of first spacers 510 may be plurally formed to be spaced apart from each other. A pair of second spacers 520 may also be plurally formed to be spaced apart from each other. The pair of second spacers 520 may be formed between the first spacers 510.

The spacer 500 may be made of polyacrylate resins, polyimide resins, or the like. The spacer 500 may be formed simultaneously with a pixel defining layer on the image displaying area PA of the first substrate 110. Further, the spacer 500 may be formed together with an insulating layer and a substrate supporting-spacer by controlling exposure dose during a process of forming the insulating layer, the substrate supporting-spacer, or the like that are formed in the image displaying area PA.

Figure 4A:
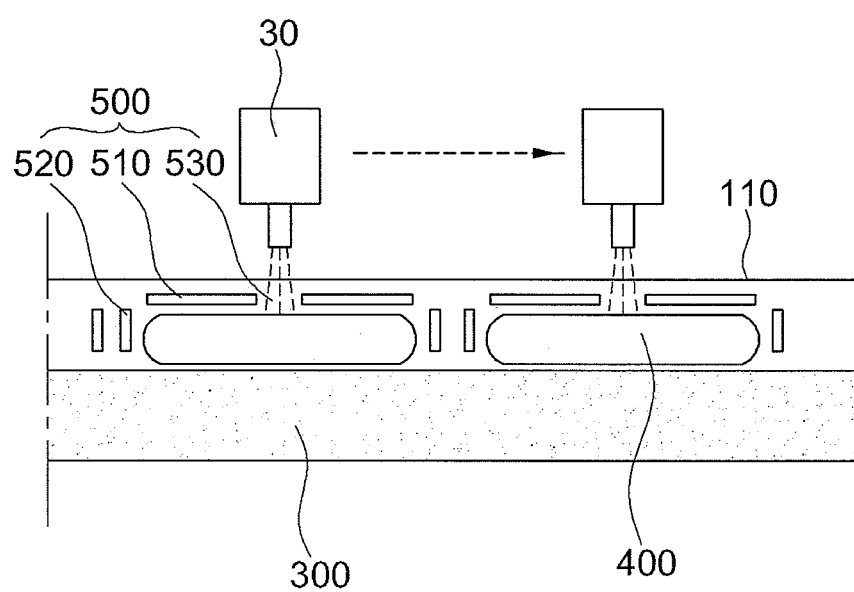
FIGS. 4A and 4B are plan views illustrating a process of injecting a reinforcing material according to an embodiment.
Figure 4B:
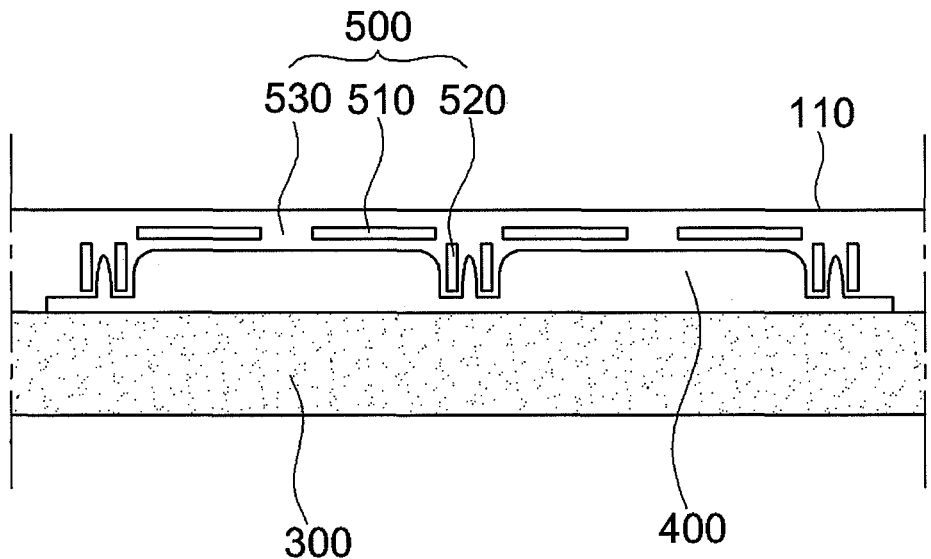

Referring to FIGS. 4A and 4B, an injection process of the reinforcing material 400 can be understood. As described above, the reinforcing material 400 may be injected utilizing the syringe 30. The reinforcing material 400 may be injected into each group of area E through the injection opening 530. The injected reinforcing material 400 may be connected to each other through a space between the second spacer 520 and the sealing material 300 that are spaced a predetermined distance apart.

Further, the reinforcing material 400 may be injected between the second spacers 520 of one group and another group so as to form a protrusion.

Figure 2B:
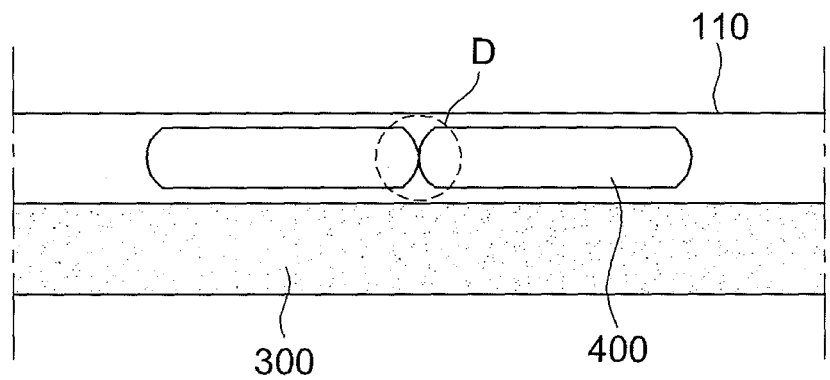

Therefore, the display device according to one embodiment may not have an empty space between the reinforcing materials 400 unlike area D shown in FIG. 2B. The spacer 500 may stably secure an area on which the reinforcing materials 400 is applied and may improve mechanical strength of the display device in conjunction with the reinforcing material 400.

The spacer 500 may have substantially the same height as the sealing material 300 and the reinforcing material 400.

Figure 5:
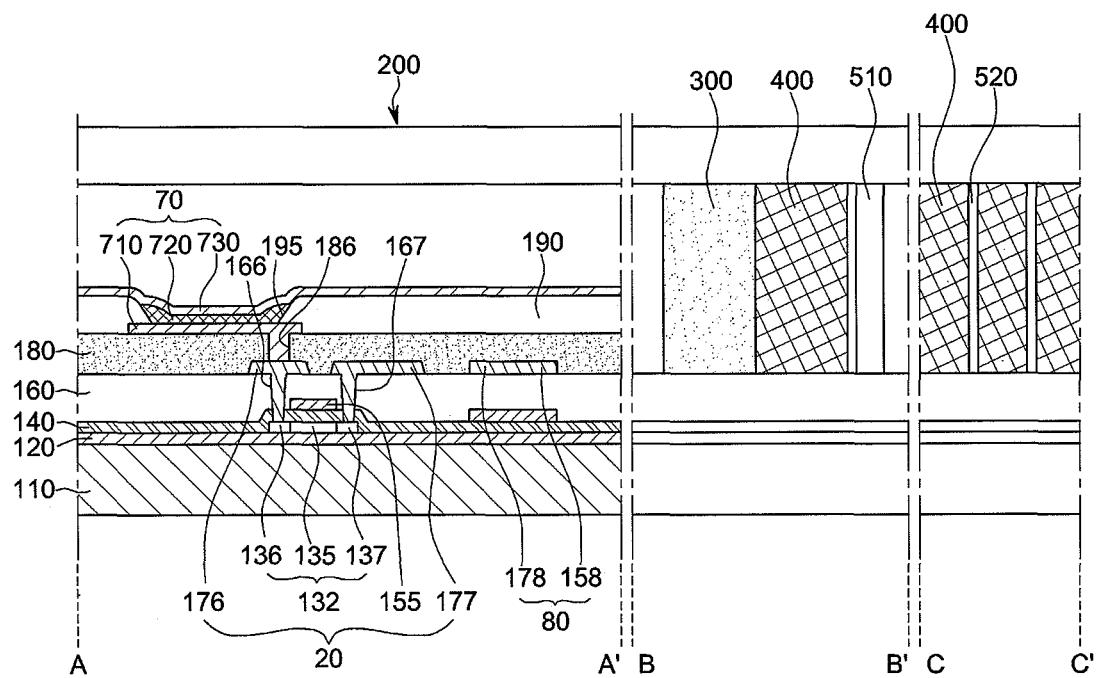
FIG. 5 is cross-sectional views of a display device according to an embodiment, taken along lines A-A', B-B', and C-C' of FIG. 1.

Hereinafter, a configuration of the image display area of the display device will be described with reference to FIG. 5.

The first substrate 110 may include an insulating substrate made of glass, quartz, ceramic, and/or plastic, but disclosed embodiments are not limited thereto. The first substrate 110 may be a metal substrate made of, for example, stainless steel.

A buffer layer 120 may be formed on the first substrate 110. The buffer layer 120 may serve to prevent infiltration of undesirable elements, such as impurities, may planarize a surface (e.g., a surface of the first substrate 110), and may be made of various different materials suitable for performing such functions. For example, the buffer layer 120 may be made of at least one selected from the group consisting of silicon nitride ($SiN_x$), silicon oxide ($SiO_2$), and/or a silicon oxynitride ($SiO_xN_y$). However, the buffer layer 120 is not always formed on the first substrate 110 and may not be provided according to the kinds and/or process conditions of the first substrate 110.

A semiconductor layer 132 may be formed on the buffer layer 120. The semiconductor layer 132 may be made of at least one selected from the group consisting of a polycrystalline silicon layer, an amorphous silicon layer, and an oxide semiconductor such as indium gallium zinc oxide (IGZO) and/or indium zinc tin oxide (IZTO). For instance, when the semiconductor layer 132 is made of the polycrystalline silicon layer, the semiconductor layer 132 may include a channel area 135 that is not doped with impurities and p+ doped drain and source areas 136 and 137 on the respective sides of the channel area 135. In one embodiment, p-type impurities, such as boron (B), may be used as dopant ions and $B_2H_6$ is generally used. Herein, such impurities may vary depending on the kinds of thin film transistors (TFTs).

According to one embodiment, a PMOS-structured TFT using the p-type impurities may be utilized as a TFT 20, but disclosed embodiments are not limited thereto. An NMOS-structured or CMOS-structured TFT may also be used as the TFT 20. Further, the TFT 20 may be a polycrystalline TFT, an amorphous TFT including an amorphous silicon layer, or an oxide semiconductor TFT.

A gate insulating layer 140 made of silicon nitride ($SiN_x$) or silicon oxide ($SiO_2$) may be formed on the semiconductor layer 132. The gate insulating layer 140 may include at least one selected from the group consisting of tetraethyl orthosilicate (TEOS), silicon nitride ($SiN_x$), and silicon oxide ($SiO_2$). For instance, the gate insulating layer 140 may have a double layer structure in which a silicon nitride layer having a thickness of about 40 nm and a TEOS layer having a thickness of about 80 nm are sequentially laminated, but disclosed embodiments are not limited thereto.

A gate wire (not shown) including a gate electrode 155 may be formed on the gate insulating layer 140. The gate wire may further include a gate line (not shown), a first storage electrode 158, and other lines. The gate electrode 155 may be formed to overlap at least a part of the semiconductor layer 132 and, for example, to at least partially overlap the channel area 135. The gate electrode 155 may prevent the channel area 135 from being doped with impurities when the drain and source areas 136 and 137 of the semiconductor layer 132 are doped with the impurities in the process of forming the semiconductor layer 132.

The gate electrode 155 and the first storage electrode 158 may be formed on the same layer and may be made of the same metal material. In this case, the metal material may include at least one selected from the group consisting of molybdenum (Mo), chromium (Cr), and tungsten (W). For example, the gate electrode 155 and the first storage electrode 158 may be made of molybdenum (Mo) or a molybdenum alloy.

An interlayer insulating layer 160 configured to cover the gate electrode 155 may be formed on the gate insulating layer 140. The gate insulating layer 140 and the interlayer insulating layer 160 may have a source contact opening 167 (e.g., a source contact hole) to expose the source area 137 of the semiconductor layer 132, and a drain contact opening 166 (e.g., a drain contact hole) to expose the drain area 136 of the semiconductor layer 132. The interlayer insulating layer 160 may be made of tetraethyl orthosilicate (TEOS), silicon nitride ($SiN_x$), or silicon oxide ($SiO_x$) similar to the gate insulating layer 140, but disclosed embodiments are not limited thereto.

A data wire (not shown) including a source electrode 177 and a drain electrode 176 may be formed on the interlayer insulating layer 160. The data wire may further include a data line (not shown), a common power line (not shown), a second storage electrode 178, and other lines. The source electrode 177 and the drain electrode 176 may be respectively coupled to the source area 137 and the drain area 136 of the semiconductor layer 132 through the contact openings 166 and 167.

The TFT 20 including the semiconductor layer 132, the gate electrode 155, the source electrode 177, and the drain electrode 176 may be formed as described above. A capacitor 80 including the first storage electrode 158 and the second storage electrode 178 may also be formed. In one embodiment, the interlayer insulating layer 160 may be a dielectric material of the capacitor 80.

The configuration of the TFT 20 is not limited to the above-described embodiment and may vary according to known configurations that can be carried out by those skilled in the art.

A planarization layer 180 configured to cover the data wire (not shown) may be formed on the interlayer insulating layer 160. The planarization layer 180 may serve to eliminate steps and to provide a planarized surface for an organic light-emitting diode (OLED) 70 in order to increase light emission efficiency of the OLED 70 that is formed on the planarization layer 180. The planarization layer 180 may have a first electrode contact opening 186 (e.g., a first electrode contact hole) to expose a part of the drain electrode 176.

The planarization layer 180 may be made of at least one selected from the group consisting of a polyacrylate resin, an epoxy resin, a phenolic resin, a polyamide resin, a polyimide resin, an unsaturated polyester resin, a polyphenylenether resin, a polyphenylene sulfide resin, and benzocyclobutene (BCB).

A first electrode 710 of the OLED 70 may be formed on the planarization layer 180. Herein, the first electrode 710 may serve as an anode. The first electrode 710 may be coupled to the drain electrode 176 through the contact opening 186 of the planarization layer 180.

A pixel defining layer (PDL) 190 having an opening to expose the first electrode 710 may be formed on the planarization layer 180. That is, the first electrode 710 may be formed to correspond to the opening of the PDL 190. The PDL 190 may be made of a polyacrylate resin or a polyimide resin.

An organic light-emitting layer 720 may be formed on the first electrode 710 in the opening of the PDL 190, and a second electrode 730 may be formed on the PDL 190 and the organic light-emitting layer 720.

The OLED 70 including the first electrode 710, the organic light-emitting layer 720, and the second electrode 730 may be formed as described above.

Any one of the first electrode 710 and the second electrode 730 may be made of a transparent conductive material and the other may be made of a transflective or reflective conductive material. According to the kinds of materials included in the first electrode 710 and the second electrode 730, an organic light-emitting diode display may be classified as a top-emission, a bottom-emission, or a both-side emission display.

The transparent conductive material may include at least one selected from the group consisting of Indium Tin Oxide (ITO), Indium Zinc Oxide (IZO), zinc oxide (ZnO), and indium oxide ($In_2O_3$). The reflective material may include at least one selected from the group consisting of lithium (Li), Calcium (Ca), lithium fluoride/Calcium (LiF/Ca), lithium fluoride/aluminum (LiF/Al), aluminum (Al), silver (Ag), magnesium (Mg), and gold (Au).

The organic light-emitting layer 720 may include a low molecular weight organic material or a high molecular weight organic material. Further, the organic light-emitting layer 720 may be formed to have a multilayer structure including at least one of a hole injection layer (HIL), a hole transport layer (HTL), a light emission layer, an electron transport layer (ETL), and an electron injection layer (EIL). For example, the hole injection layer (HIL) may be formed on the first electrode 710 serving as an anode, and the hole transport layer (HTL), the light emission layer, the electron transport layer (ETL), and the electron injection layer (EIL) may be sequentially laminated on the hole injection layer (HIL).

The second substrate 200 may be formed on the OLED 70. The second substrate 200 may be formed opposite to the first substrate 110 so as to cover the TFT 20 and the OLED 70. The second substrate 200 may be formed to be a transparent insulating substrate made of glass, quartz, or ceramic similar to the first substrate 110. Further, the second substrate 200 may be a sealing member and may have a thin film structure in which an organic layer and an inorganic layer are alternately laminated.

In an embodiment including a liquid crystal display (LCD), the first electrode 710 may be physically and electrically coupled to the drain electrode 176 through the contact opening 186 and may receive data voltage from the drain electrode 176. The first electrode 710, receiving the data voltage, may generate an electric field together with the second electrode, receiving a common voltage, thereby determining a direction (e.g., an orientation) of liquid crystal molecules of a liquid crystal layer between the two electrodes. The first electrode 710 and the second electrode may form a capacitor (hereinafter referred to as a "liquid crystal capacitor") so as to maintain the applied voltage after the TFT is turned off.

From the foregoing, it will be appreciated that while the inventive technology has been described herein for purposes of illustration, and that various modifications may be made without departing from the scope and spirit of the present teachings. Accordingly, the various embodiments disclosed herein are not intended to be limiting of the true scope and spirit of the present teachings.

What is claimed is:

1. A display device comprising:
   a first substrate in which an image displaying area and a non-displaying area are defined;
   a second substrate facing the first substrate;
   a first electrode formed over the first substrate;
   an emission layer formed over the first electrode;
   a second electrode formed over the emission layer;
   a sealing member interposed between the non-displaying area of the first substrate and the second substrate;
   a reinforcement member interposed between the non-displaying area of the first substrate and the second substrate, the reinforcement member being adjacent to the sealing member; and
   at least one spacer formed adjacent to the reinforcement member, wherein the spacer comprises a plurality of first spacers, wherein each of the sealing member and the spacer has a height defined in the depth dimension of the display device, and wherein the height of at least one of the first spacers is substantially the same as that of the sealing member.

2. A display device comprising:
   a first substrate in which an image displaying area and a non-displaying area are defined;
   a second substrate facing the first substrate;
   a first electrode formed over the first substrate;
   an emission layer formed over the first electrode;
   a second electrode formed over the emission layer;
   a sealing member interposed between the non-displaying area of the first substrate and the second substrate;
   a reinforcement member interposed between the non-displaying area of the first substrate and the second substrate, the reinforcement member being adjacent to the sealing member; and
   at least one spacer formed adjacent to the reinforcement member,
   wherein the spacer comprises:
   a plurality of first spacers formed substantially parallel to a first side of the reinforcement member; and
   a plurality of second spacers respectively formed adjacent to a second side of the reinforcement member in a direction substantially perpendicular to the first spacers, wherein the second side is shorter than the first side.

3. The display device of claim 2, wherein the spacer has a width in the range of about 1 μm to about 2 μm.

4. The display device of claim 3, wherein the first spacers are formed adjacent to a long side of the reinforcement member.

5. The display device of claim 4, wherein the reinforcement member comprises a protrusion between the spacers.

6. The display device of claim 2, wherein the second spacers are spaced apart from each other.

7. The display device of claim 2, wherein each of the first spacers has a length in the range of about 0.4 μm to about 0.6 μm.

8. The display device of claim 2, wherein each of the second spacers has a length in the range of about 0.1 μm to about 0.25 μm.

9. The display device of claim 1, further comprising a pixel defining layer formed over the first substrate, the pixel defining layer having an opening corresponding to the first electrode.

10. The display device of claim 9, wherein the spacer and the pixel defining layer are formed of the same material.

11. The display device of claim 1, wherein the sealing member comprises a frit.

12. A display device comprising:
    a first substrate in which an image displaying area and a non-displaying area are defined;
    a second substrate facing the first substrate;
    a sealing member interposed between the non-displaying area of the first substrate and the second substrate;

a reinforcement member interposed between the non-displaying area of the first substrate and the second substrate, the reinforcement member being adjacent to the sealing member; and at least one spacer formed adjacent to the reinforcement member, wherein the spacer comprises:

a plurality of first spacers formed substantially parallel to a first side of the reinforcement member; and a plurality of second spacers respectively formed adjacent to a second side of the reinforcement member in a direction substantially perpendicular to the first spacers, wherein the second side is shorter than the first side.

13. The display device of claim 12, wherein each of the first and second spacers has a width in the range of about 1 µm to about 2 µm.

14. The display device of claim 12, wherein each of the first and second spacers has substantially the same height as the sealing member.

15. The display device of claim 12, wherein the reinforcement member comprises a protrusion between the first and second spacers.

16. The display device of claim 12, wherein the second spacers are spaced apart from each other.

17. The display device of claim 12, wherein each of the first spacers has a length in the range of about 0.4 µm to about 0.6 µm.

18. The display device of claim 12, wherein each of the second spacers has a length in the range of about 0.1 µm to about 0.25 µm.

19. The display device of claim 12, wherein the first spacers are formed adjacent to the first side of the reinforcement member.

20. The display device of claim 1, wherein the reinforcement member has a height defined in the depth dimension of the display device, and wherein the height of at least one of the first spacers is substantially the same as that of the reinforcement member.

* * * * *